(12) United States Patent
Redman-White

(10) Patent No.: US 7,847,608 B2
(45) Date of Patent: Dec. 7, 2010

(54) DOUBLE DATA RATE INTERFACE

(75) Inventor: William Redman-White, Medstead (GB)

(73) Assignee: NXP B.V., Eindhoven (NL)

( * ) Notice: Subject to any disclaimer, the term of this patent is extended or adjusted under 35 U.S.C. 154(b) by 145 days.

(21) Appl. No.: 12/282,470

(22) PCT Filed: Mar. 9, 2007

(86) PCT No.: PCT/IB2007/050788
§ 371 (c)(1), (2), (4) Date: Sep. 10, 2008

(87) PCT Pub. No.: WO2007/105156
PCT Pub. Date: Sep. 20, 2007

(65) Prior Publication Data
US 2009/0066380 A1    Mar. 12, 2009

(30) Foreign Application Priority Data
Mar. 13, 2006   (EP) ................................. 06111040

(51) Int. Cl.
*H03L 7/06* (2006.01)

(52) U.S. Cl. ........................ 327/158; 327/147; 327/156; 365/201; 365/233.13

(58) Field of Classification Search ................. 327/147, 327/156, 158; 365/201, 233.13; 711/105
See application file for complete search history.

(56) References Cited

U.S. PATENT DOCUMENTS

| | | |
|---|---|---|
| 6,111,446 A | 8/2000 | Keeth |
| 6,442,102 B1 | 8/2002 | Borkenhagen et al. |
| 6,950,350 B1 | 9/2005 | Kerl |
| 2002/0180500 A1* | 12/2002 | Okuda et al. ................. 327/158 |
| 2003/0004667 A1 | 1/2003 | Zumkehr |
| 2005/0105349 A1* | 5/2005 | Dahlberg et al. ............. 365/201 |

* cited by examiner

*Primary Examiner*—Lincoln Donovan
*Assistant Examiner*—John W Poos

(57) ABSTRACT

The present invention relates to a double data rate interface and method for use between a processor and random access memory, comprising a delay line including means for creating a delay in a data strobe signal from the random access memory, the delay line being arranged such that the delay in the data strobe signal is equal to the sum of set-up time and data bus rise time. The interface of includes the delay line comprising the delay locked loop which in turn comprises a ring oscillator. The ring oscillator includes a buffer and a Vernier delay.

19 Claims, 11 Drawing Sheets

DOUBLE DATA RATE INTERFACE

FIELD

The present invention relates to Double Data Rate (DDR) Synchronous Dynamic Random Access Memory (SDRAM) and in particular an interface timing system, and to a Delay Locked Loop for use therein.

DESCRIPTION OF THE RELATED ART

It is well known that SDRAM uses a square wave clock signal to transfer data. Traditional SDRAM arrangements, like most synchronous circuits, perform the data transfer on a low-to-high transition of the clock signal ignoring the opposite high-to-low transition. DDR-SDRAM on the other hand acts on both low-to-high and high-to-low transitions of the clock signal thereby doubling the transfer rate for a particular clock rate or on the other hand halving the required clock rate for a given data transfer rate.

BRIEF SUMMARY

FIG. 1a show the key elements of an interface employed in DDR transfer whilst FIG. 1b shows a typical timing diagram for such a transfer. A clock signal CLK is sent from the processor to the DDR memory. The DDR memory utilises this signal to generate a READ cycle command signal. In the read cycle, the DDR memory generates a read data valid signal DQS which is a bi-directional data strobe moving in parallel with a Data signal (DQs) so that DDR memory can use DQS as a reference signal to fetch and receive corresponding DQs.

Typically DQS and DQs will have the same physical characteristics such that there is no skew between DQS and DQs during a data transfer from DDR SDRAM to the processor or vice versa.

On low-to-high transitions, or rising edges of the DQS, DATA0 values are presented to the processor input. Alternatively, whilst on high-to-low or falling edges of the DQS, DATA1 values are presented to the processor. A valid data strobe preamble is required before the READ transfer DQs can be considered valid whilst a data strobe postamble is required to terminate this process, as shown in FIG. 1b. The preamble phase defines a stable logic status before any data transfer occurs whilst the postamble is required to disable DQS logic from receiving any further data after finishing a read operation.

The processor must then latch the received data some time after the valid DQS so as to comply with the SET-UP and HOLD timing constraints of the internal latches, whilst also complying the rise and fall times associated with the data bus.

The JEDEC Solid State Technology Association DDR memory specifications indicate that the timing for the DATA0 delivery phase and the DATA1 delivery phase should be equal. The HIGH time, i.e. the 'mark' and the LOW time, i.e. the 'space', of a pulse waveform combine to define a mark-space-ratio which for DDR specifications is generally 50:50 or 1. As a result of such a unity mark-space-ratio, the latch signals or instants for the READ data latches should ideally occur at the mid-point of the DQS so as to achieve the longest SET-UP and HOLD periods.

A Delay Locked Loop (DLL) arrangement determines the latching signals for the DATA0 and DATA1 phases and introduces a delay time from fixed 90° and 270° phase delays of the reference clock signal.

That is, the DDL is used to create a series of four delays which sum together to equal a single period of the reference clock signal. In this manner, each delay is a quarter of the total period of the reference clock signal. For example, using a reference clock signal frequency of 250 MHz implies a total period of 4.0 ns and a delay of 1.0 ns for each of the four delays.

For latching signals to be centred on the mid-point of the DQS period in a READ cycle, with an equal mark space ratio, then delaying the positive or rising edge of DQS by a quarter of its period, i.e. by a phase of 90° will result in optimal timing of the DATA0 phase. Similarly, for the DATA1 phase, delaying the rising edge of DQS by three-quarters of its period, i.e. by a phase of 270° will result in optimal timing of the DATA1 phase. FIG. 2a shows DDR READ based on a DQS delay of 90° and 270° with respect to the clock signal, whilst FIG. 2b shows an ideal data-timing diagram for 90° and 270° delay latching signals.

However, problems with the above arrangement can occur when the data phases from the DDR memory do not exhibit a 50:50 time relationship or mark-space-ratio. This can arise internally to the DDR memory and FIGS. 3a and 3b show timing diagrams showing this problem. With FIG. 3a the timing of the latch signals is derived with respect to the rising edge of the DQS using a nominal fraction of the clock period. The 90° delayed latching signal takes place in the region of the DQ signal which has risen to its maximum value so that latching takes place in a safe region for the DATA1 phase. However, as a result of the mark-space-ratio not being unity or 50:50, the 270° delayed latching signal does not occur at the maximum value of the DQ signal such that it violates the hold time for the shorter DATA0 phase.

FIG. 3b shows the opposite situation in which the latching signal arises in a safe region for the DATA0 phase, but violates the set-up time for the shorter DATA1 phase.

Attempted solutions to this problem are shown in FIGS. 4a and 4b, using for example READ Timing via inverted 90° output. The scheme shown in FIG. 4a improves SET-UP timing where the mark space ratio is greater than 50%, however, there is a greater risk of a hold time error. The situation where the mark space ratio is less than 50% provides no improvement whilst also having a risk of a hold time error.

Data are input to the processor by latching a data value in a latch. The set-up is the time for the required for the data to become stable before the command to store the data arrives (i.e. the edge of the data strobe signal DQS) and the time the data are required to be stable after the command signal edge. The absolute value of the set-up time is a function the response time of the latch required to input data and therefore the specific integrated circuit technology and design of the latch.

The problems of timing delays as discussed are generic to high speed DDR interfacing and have a variety of sources, such as the memory chip not meeting the JEDEC specifications or through timing delays introduced by the printed circuit board (PCB) on which the memory chips are mounted. Moreover, it is recognised that the problem of timing delay will increase as clock frequencies increase.

The present invention seeks to provide a DDR interface and method for use with a processor and random access memory having advantages over such known systems and methods.

The invention also seeks to provide for a particularly advantageous arrangement for controlling a delay period for use in relation to such an interface.

According to a first aspect of the invention, there is provided a double data rate interface arranged for use between a processor and random access memory, comprising a delay line including means for creating a delay in a data strobe signal from the random access memory, the delay line being arranged such that the delay in the data strobe signal is equal to the sum of set-up time and data bus rise time As a result, the DDR interface of the present invention prevents Set-up and Hold violations in data transfer between SDRAM and a processor. In particular the present invention prevents such situations where a mark space ratio of a data or a data enable signal is not 50:50 or unity.

According to a further aspect of the invention there is provided a delay locked loop arranged to receive a clock reference signal and including a Vernier delay comprising a ring oscillator formed of a plurality of variable delay elements for producing a ring oscillator signal, a first divider for dividing the ring oscillator signal and a second divider for dividing the clock reference signal, and means for programming the first and second dividers to vary the ratio therebetween so as to determine the required delay offered by the delay locked loop.

Preferably, the delay locked loop is arranged to achieve a delay resolution in a master delay line and the buffer is arranged to compensate for an extra delay required to drive a fast clock edge from the master delay line.

Advantageously, the time value of each delay element is replicated within a slave delay line.

More preferably, the delay line of the interface DDR comprises a delay locked loop and the delay locked loop is arranged to be controlled by a clock signal of the processor.

According to a further aspect of the invention there is provided a method of double data rate transfer between a processor and random access memory whereby a delay line creates a delay in a data strobe signal of said random access memory, the method including the step of delaying the data strobe signal by a period substantially equal to the sum of set-up time and data bus rise time.

Preferably, the method includes the step of creating the delay in a delay locked loop and further includes controlling the delay locked loop by means of a clock signal of the processor, whereby the delay locked loop is arranged to achieve a delay resolution in a master delay line.

Preferably still, the delay locked loop utilises a ring oscillator, and the method includes compensating for an extra delay required to drive a fast clock edge from the delay line by way of a buffer within the ring oscillator.

More preferably, the double data rate timing system includes a data transfer interface for transfer of data between the processor and the random access memory.

According to yet another aspect of the invention, there is provided a method of controlling a delay period of a delay locked loop arranged for receiving a clock reference signal and comprising a ring oscillator having a plurality of variable delay elements for producing a ring oscillator signal, the method including the steps of dividing the ring oscillator signal by a first value, dividing the clock reference signal by a second value and varying the ratio of the said first and second values so as to control the said delay period provided by the delay locked loop.

BRIEF DESCRIPTION

The invention is described further hereinafter, by way of example only, with reference to the accompanying drawings, in which.

DETAILED DESCRIPTION

Figure 1A:
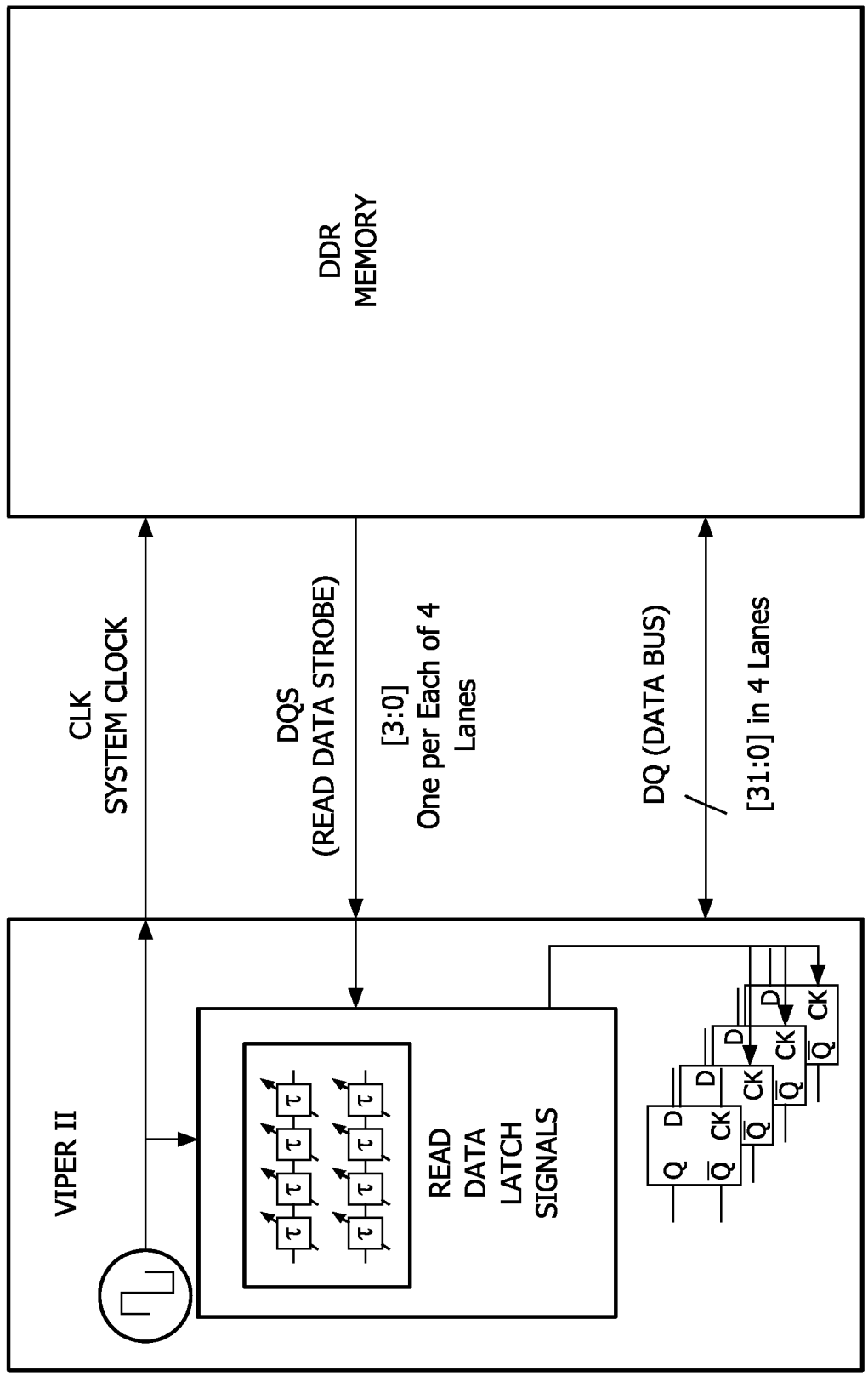
FIG. 1 shows a block diagram of typical DDR interface according to the prior art.
Figure 1B:
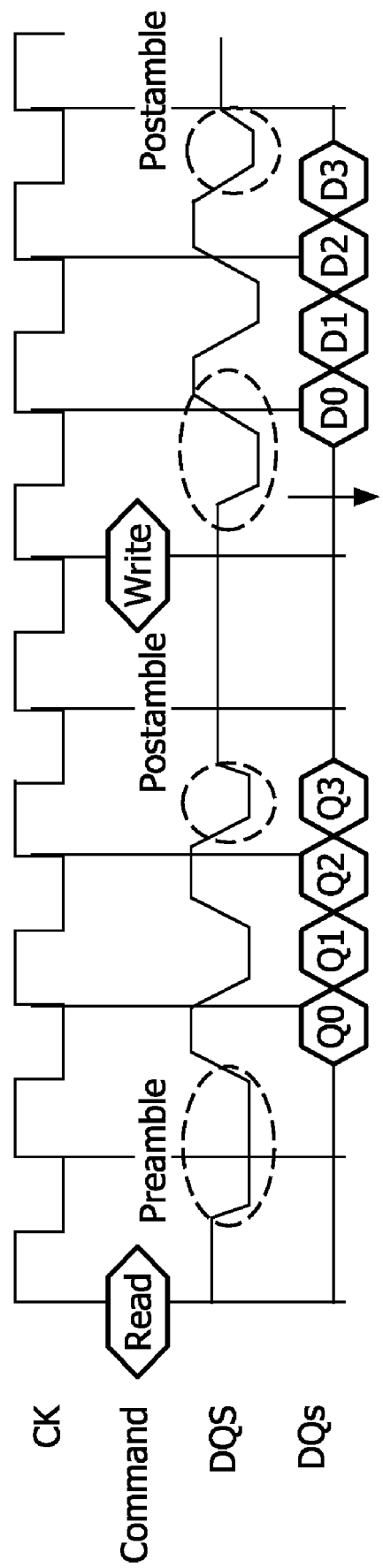
Figure 2A:
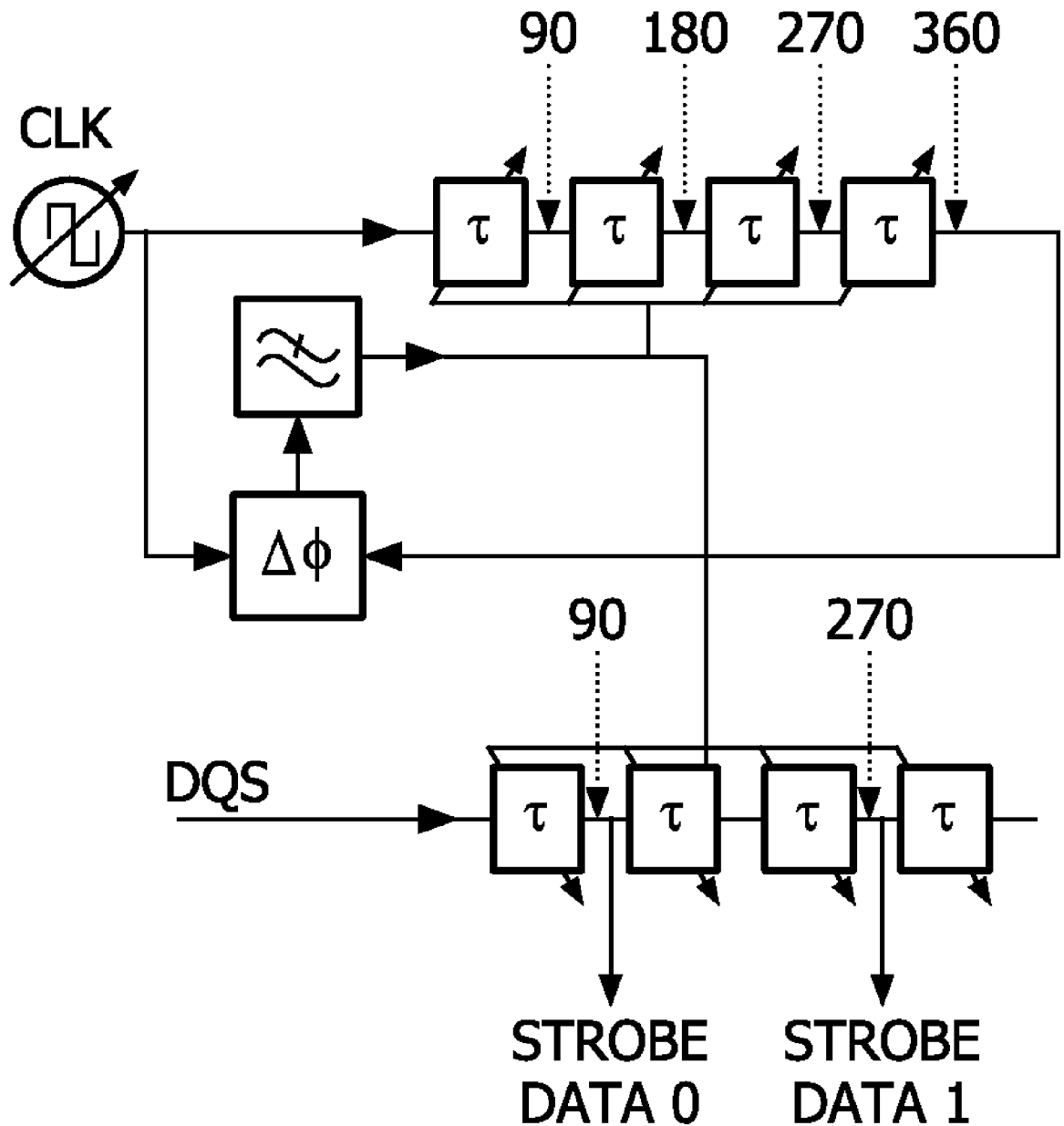
FIG. 2a shows a block diagram DDR READ timing based on a DQS delay of 90° and 270° with respect to the clock period according to the prior art.
Figure 2B:
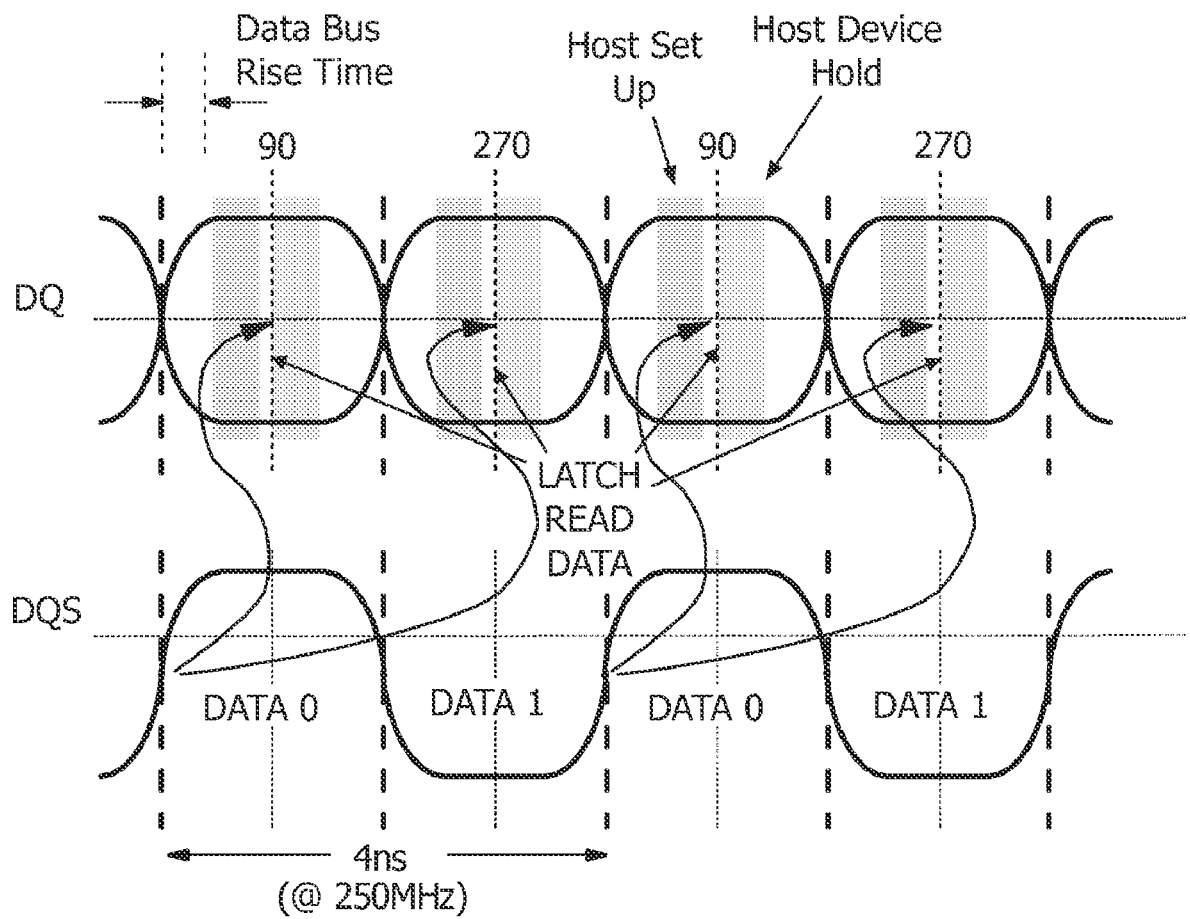
FIG. 2b shows a DDR READ timing diagram based on a DQS delay of 90° and 270° with respect to the clock period according to the prior art.
Figure 3A:
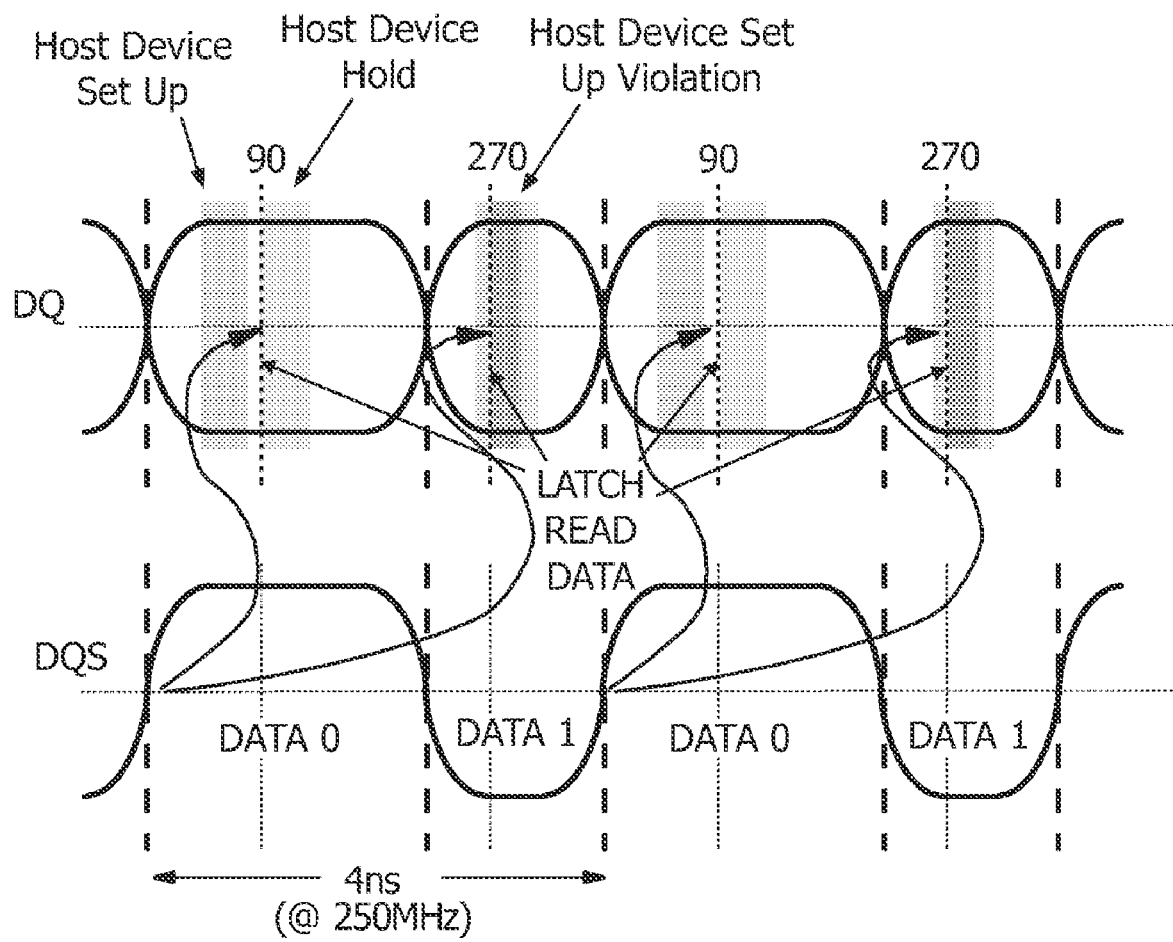
FIG. 3a shows DDR READ timing set-up violations based on Data 1 DQS delay of 90° and 270° with respect to the clock period according to the prior art.
Figure 3B:
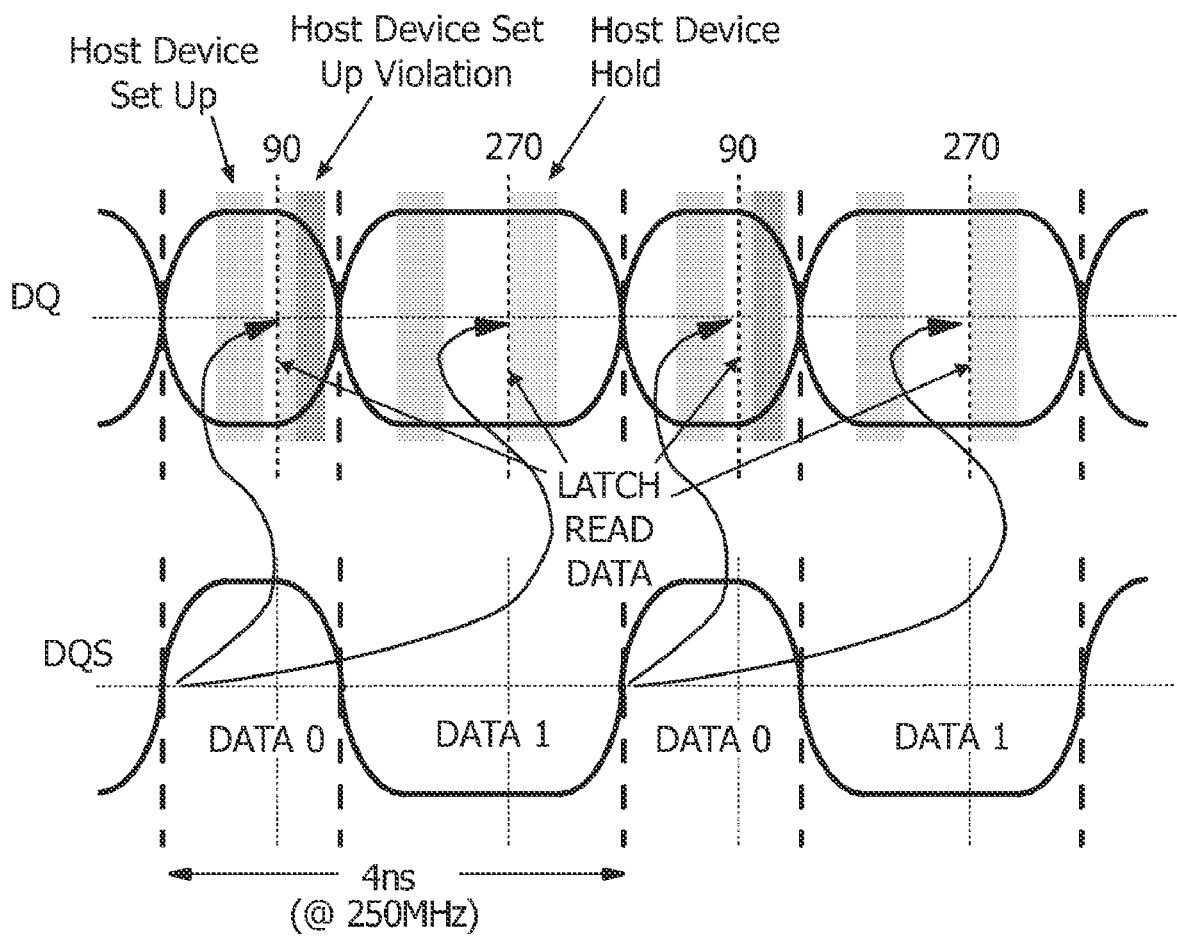
FIG. 3b shows DDR READ timing set-up violations based on Data 0 DQS delay of 90° and 270° with respect to the clock period according to the prior art.
Figure 4A:
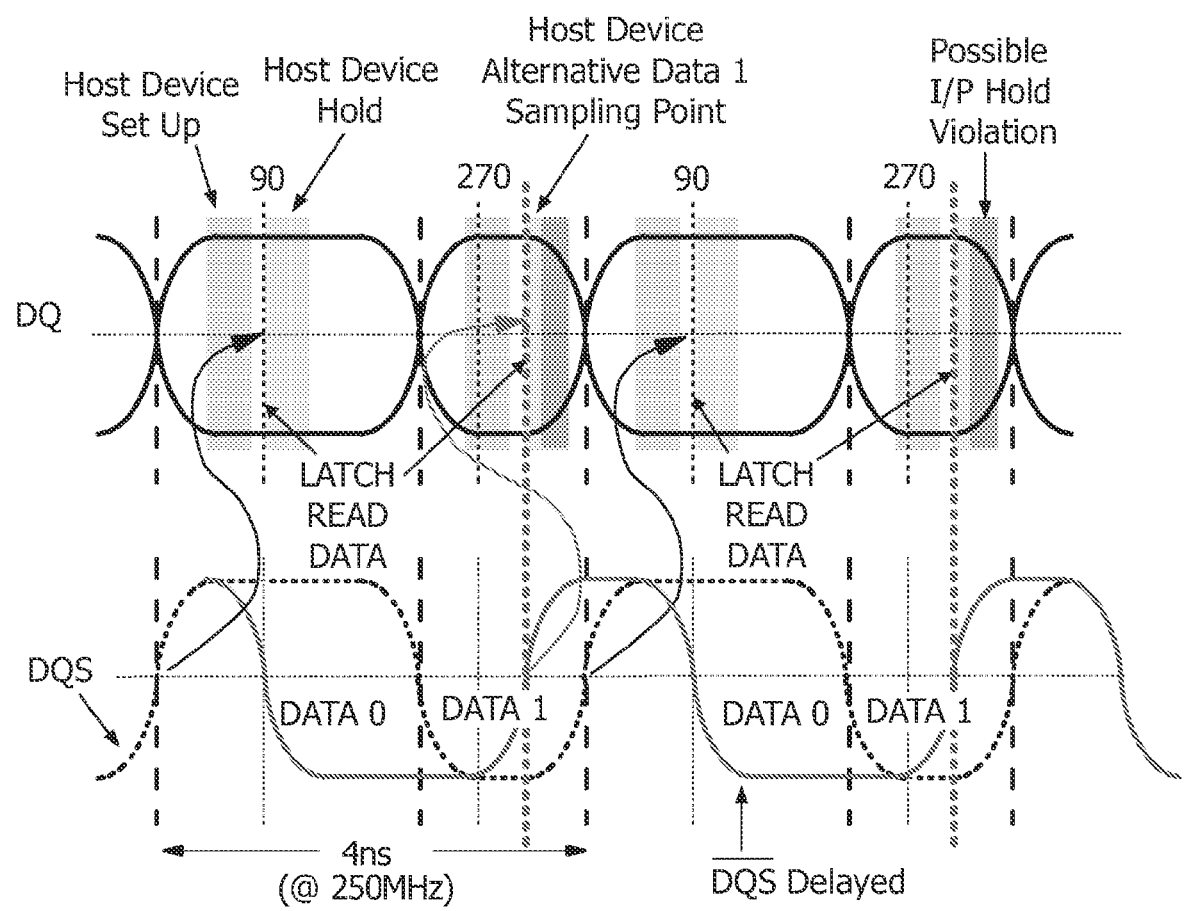
FIG. 4a shows a READ timing via inverted 90° output where the mark-space-ratio is greater than 50% according to the prior art.
Figure 4B:
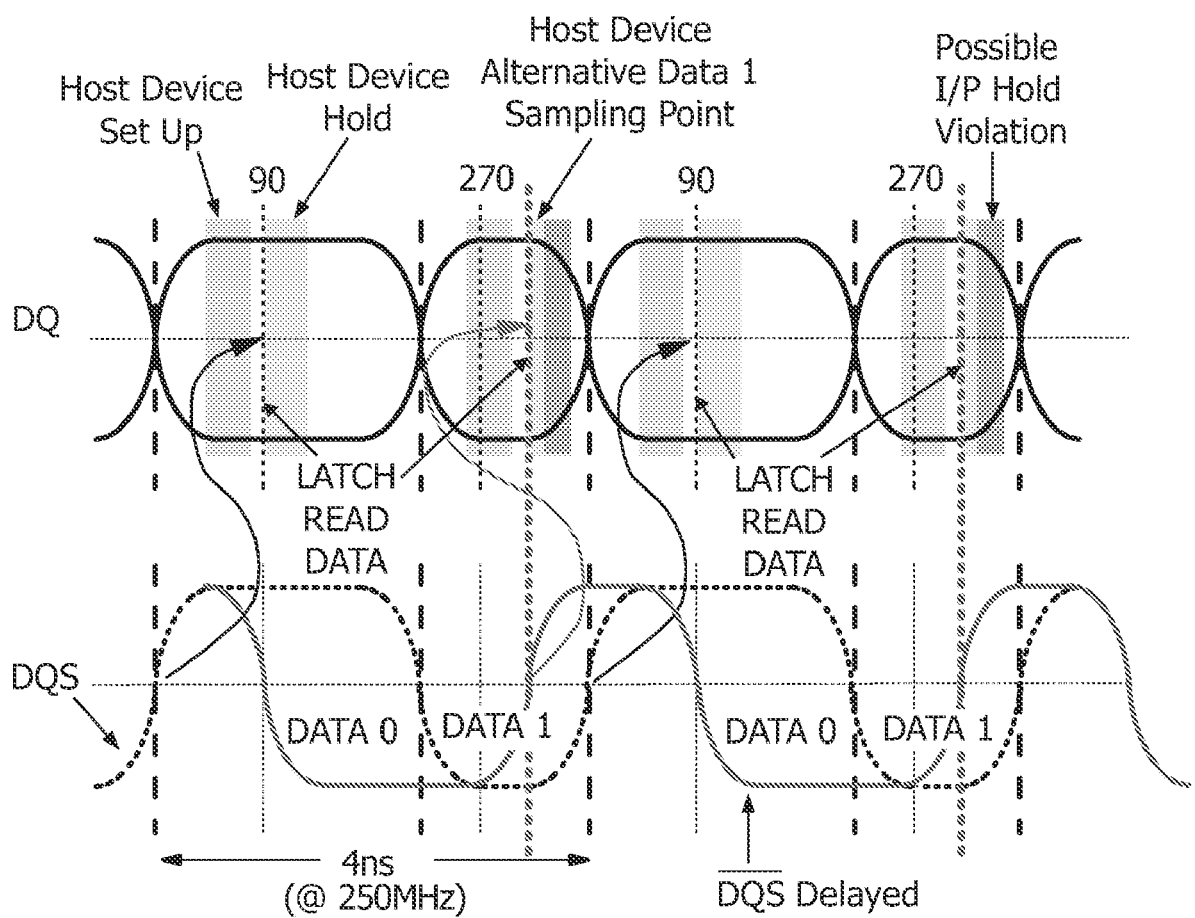
FIG. 4b shows a READ timing via inverted 90° output where the mark-space-ratio is less than 50% according to the prior art.
Figure 5:
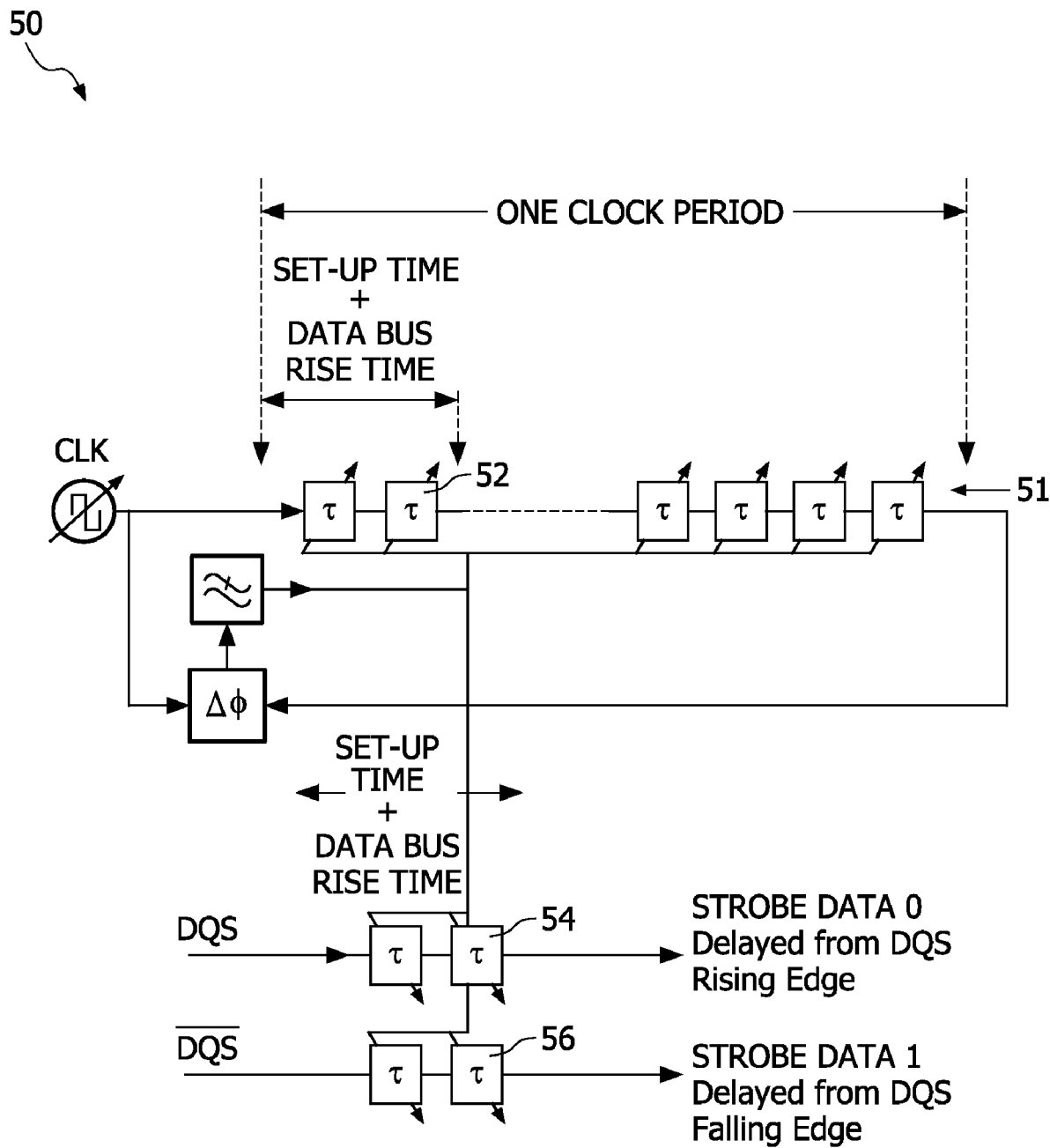
FIG. 5 illustrates a block diagram of DDR READ timing generation according to an embodiment of the present invention.

In overview and referring to FIG. 5 the DDR-SRAM timing interface 50 according to an embodiment of the present invention utilises a delay line 51 wherein a delay time introduced by the delay line 51 is equal to the total set-up time including the bus rise time for the input DQ signal. This is achieved by using a delay-locked loop 52 controlled by the clock signal CLK inside the processor (not illustrated), so that the time resolution is equal to the total set-up time. Slave delay lines 54, 56 are used to create a delay in the DQS signal.

Any suitable element can be utilised, for example an inverter stage. Typically the variable delay element or a delay locked loop or ring oscillator is implemented by restricting the current supply to a series of CMOS inverters, where the current is restricted either to each individual delay line element 64 or to all the elements jointly. Alternatively, it is also possible to reduce the supply voltage to each delay line element 64 to achieve the same ends. Consequently, this leads to the effective supply current/voltage at each delay line element 64 output being lower than the nominal supply, and therefore a level shifting buffer 69 is required to ensure the logic signals can be reliably passed from the delay line to the logic of the processor.

Figure 6:
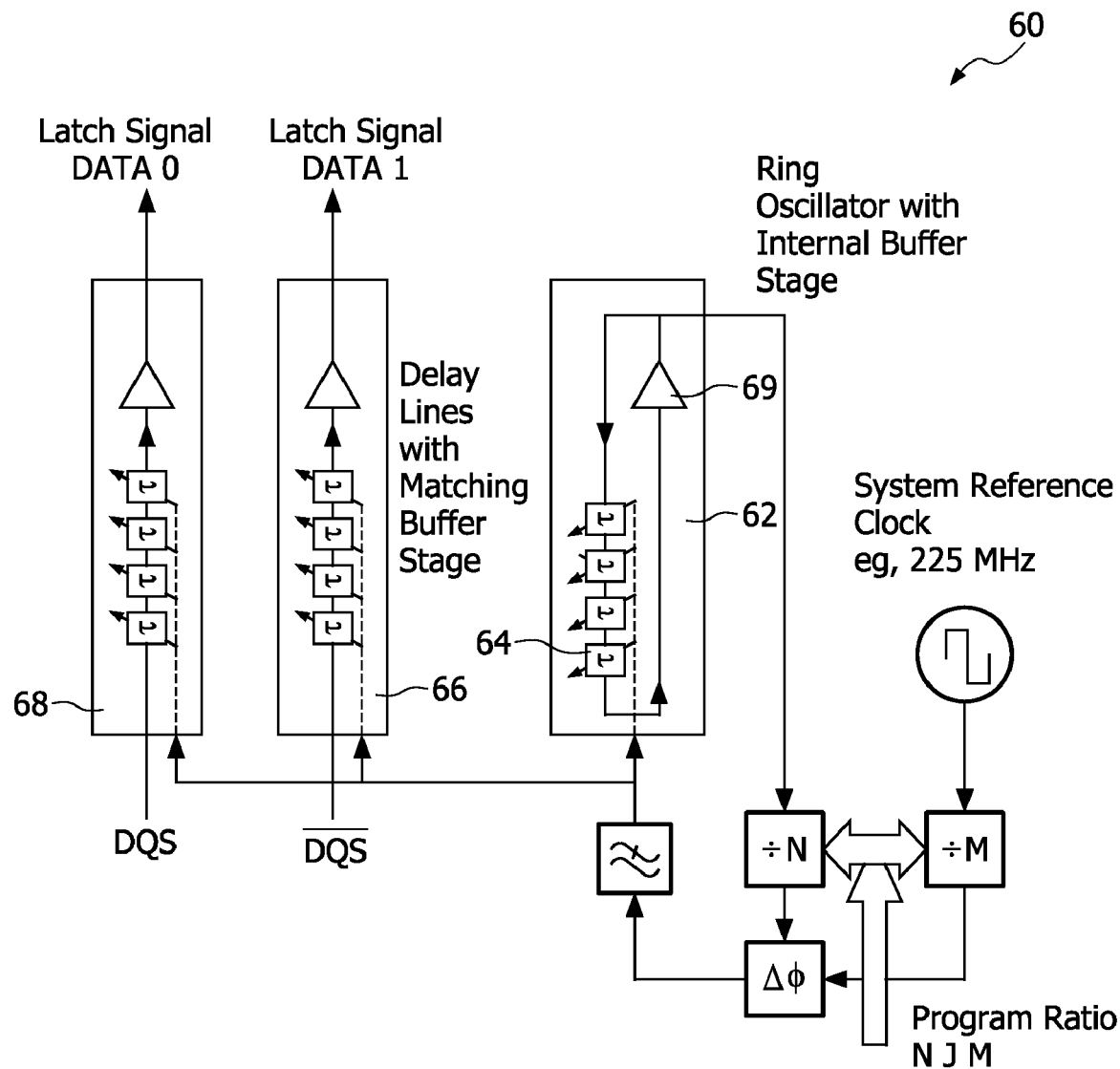
FIG. 6 illustrates a Vernier timing delay generator for use within an embodiment of the present invention.

FIG. 6 illustrates a Delay Locked Loop offering a Vernier action 60 employed for introducing the delay resolution into the master delay line. The Vernier delay 60 includes a ring oscillator 62 formed from variable delay line elements 64 of the required delay line. The ring oscillator and the slave delay lines 66, 68 are both preferably voltage driven so that each stage has the same delay. Although illustrated within the context of a DDR interface system, it should be appreciated that the Delay Locked Loop need not be so limited.

If current supply is used then the demand from the ring oscillator 62 will be constant, leading to a constant internal voltage on the variable delay line elements. Conversely, the supply current in the delay line will be a function of the data through it. Using the current supply to control the ring oscillator 62, the delay line should be driven from a voltage buffer which senses the voltage on the ring oscillator and hence tracks the stage delay in the ring oscillator 62.

Since the total delay is less than the time for one complete period of the reference clock signal DQ, it will be appreciated that the period of oscillation will be higher. However, by including a buffer level shift in the ring oscillator, it is also possible to compensate for the extra delay due to the buffer required to drive a fast DQS signal edge from the delay line.

The master ring oscillator 62 preferably comprises an odd number of delay elements, such that the edge of the DQS signal running around the ring is always inverted and there is no stable latched state. If the total delay of all the elements in the ring has a value of D seconds, then the frequency of oscillation of the ring oscillator will be ½D Hz, since the high-to-low and low-to-high edges of the DQS signal must go around the ring in a defined period in order to start oscillation.

The period of oscillation of the new "master" ring oscillator D, will be of the order of ¼ that of the reference clock period T, but not necessarily a small integer fraction.

If the ring oscillator frequency is divided by N, and the reference clock frequency is divided by M, the loop will lock up with the ring oscillator running at 1/D Hz so that:

$$\tfrac{1}{2}DN = 1/TM$$

and the delay period can then be given by $$D = TM/2N$$

That is the value of the delay that comprises a digitally programmable fraction of the reference clock period.

It should therefore be appreciated that a particularly important aspect of the delay locked loop that can be employed within the interface of the present invention is the manner in which the Vernier delay action is achieved. As noted, this involves employing a ring oscillator comprised of variable delay elements and which is effectively forced to run at an arbitrary frequency by means of the programmable divider, an embodiment of which is illustrated in FIG. 6 and which is provided within the closed loop.

The delay element will be forced to resolve a particular given time delay which can be readily programmed in a precise manner by altering the ratio of the two dividers N/M as discussed above.

The time delay of each delay element is then replicated within the slave delay line by virtue of matching between the respective integrated components.

In the illustrated embodiment of FIG. 6, buffers are illustrated in the ring oscillator and within the delay line and prove important if the delay element is realised by means of an inverter with a variable local supply voltage. The buffer in the delay line, and in the output from the ring oscillator, is then required to drive the divider N and so compensate for the internal logic levels within the delay line/ring oscillator not being as large as normally required.

As a further alternative, the delay line and the associated ring oscillator can be formed of sub-blocks comprising variable delay cells and a buffer. In one particular example, three such sub-blocks can be provided to form a ring oscillator, while one, two or three such blocks can be provided to form a delay line.

The sub-division of the delay line and the ring oscillator in this manner provides a wider tuning range with advantageously simplified circuit design of the individual blocks. Through the provision of a buffer within each sub-block, it remains readily possible to achieve time-matching in the required ratio.

Returning to the particular embodiment shown in FIG. 6, for the Phase 0 data, the rising edge is taken directly as DQS, whereas for the Phase 1 data the compliment of DQS is taken so that the falling edge creates a rising latch signal.

It is assumed that the edges of the DQS signal are reliable and that the positive or negative edge of that signal immediately preceding each phase of the data transfer is reliable in defining the start of the valid data period. Moreover, the set-up plus the rise times of the data bus i.e. the total set up time, sent to the processor are known to the worst case of the Process Voltage Temperature (PVT) variations which affect the speed of the logic elements. The total set up time can be described as a fraction of the total clock period.

Figure 7:
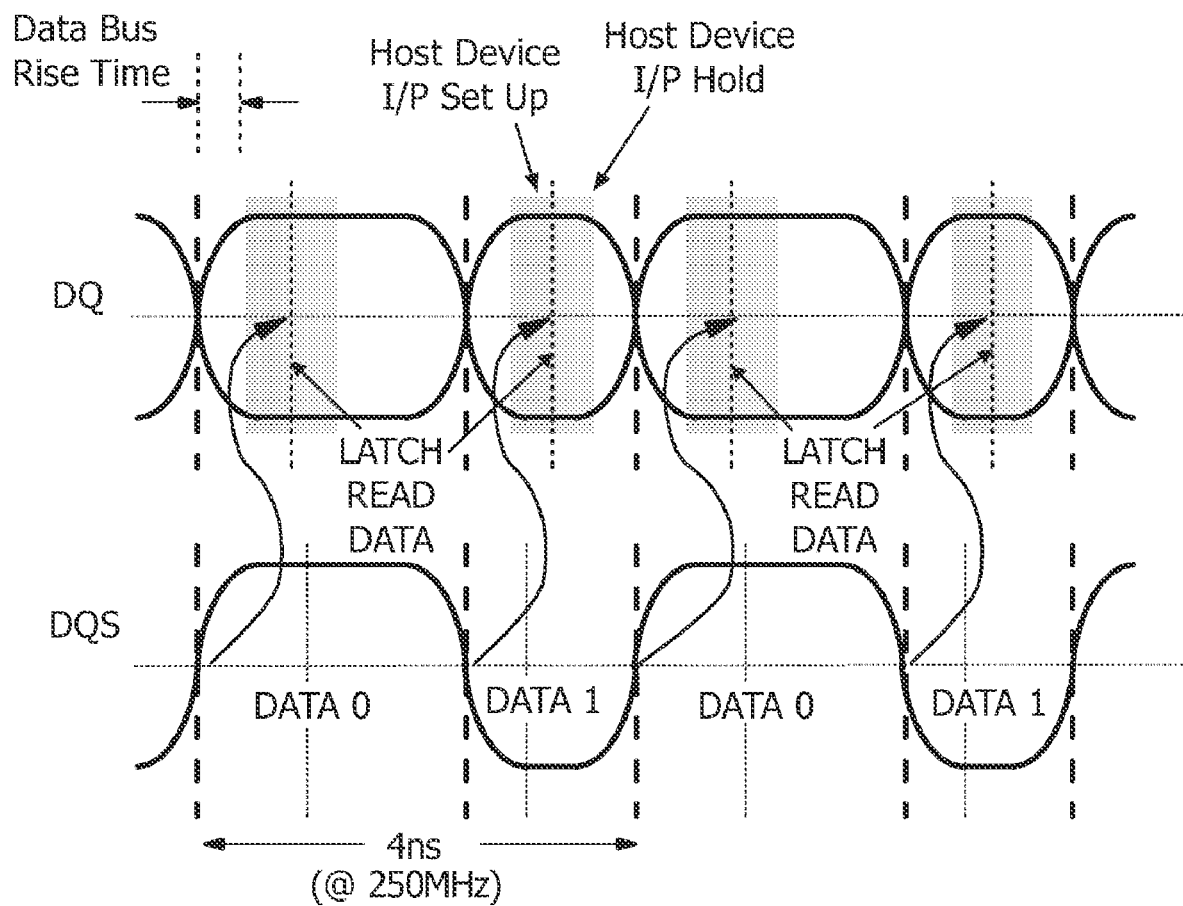
FIG. 7 illustrates a timing diagram according to an embodiment of the present invention.

As illustrated in FIG. 7, the sampling of the incoming data now occurs close to the optimum achievable by open-loop means. Further optimisation is possible by utilising phase selection based on continuous monitoring of the DQS signal and identifying edge timing relationships by sampling large lengths of the data due to the non-periodic nature of the signal.

It will be appreciated by the skilled person that the DDR interface of the present invention can include a timing system incorporating a processor, such as a microprocessor, arranged for use with synchronous dynamic random access memory or other forms of random access memory. Whereby the time system controls data transfer between the processor and the random access memory. The system also incorporates means for data transfer such as a data bus of any appropriate size, such as 4 bit, 8 bit, 64 bit and so on.

In this way, it is possible to set the timing of the data strobe pulse such that delays occurring as a result of delay skew between DQS and DQs can be accounted for and the data are latched with the maximum set up and hold times as seen by the processor, and in particular the processor bus input latch. As a result, the present invention enables generation of timing signals which prevent the Set-Up and Hold violations in data transfer between SDRAM and a processor that have been identified in the current art. In particular the present invention enables generation of timing signals which prevent such situations where a mark space ratio of a data or a data enable signal is found not to be 50:50, i.e. unity. As understood by those skilled in the art the precise nature of the timing can therefore be set up for a particular implementation of processor and/or PCB to account for delays inherent to that implementation.

The invention claimed is:

1. A delay locked loop arranged to receive a clock reference signal and including a Vernier delay comprising:
   a ring oscillator formed of a plurality of variable delay elements for producing a ring oscillator signal;
   a first divider for dividing the ring oscillator signal;
   a second divider for dividing the clock reference signal; and
   means for programming the first and second dividers to vary a ratio therebetween so as to determine a required delay offered by the delay locked loop.

2. The delay locked loop as claimed in claim 1 and arranged such that the delay period comprises a fraction of the clock reference period, wherein the said fraction is determined by the ratio of the first divider to the second divider.

3. The delay locked loop as claimed in claim 1, wherein the time value of each delay element is replicated within a slave delay line.

4. The delay locked loop as claimed in claim 3, wherein the slave delay line includes a buffer.

5. The delay locked loop as claimed in claim 1, and including a buffer within the ring oscillator.

6. The delay locked loop as claimed in claim 5, wherein the buffer is arranged to compensate for an extra delay required to drive a fast clock edge.

7. The delay locked loop as claimed in claim 6, wherein the delay line in the oscillator and the slave delay line may be comprised of numbers of groups of individual variable delay elements such that the delays implemented in the oscillator and in the slave line have an integer ratio time value relationship.

8. The delay lock loop of claim 1, wherein the required delay is proportional to a bus rise time for an input data (DQ) signal.

9. The delay lock loop of claim 1, wherein the ring oscillator comprises a series of Complementary Metal Oxide Semiconductor (CMOS) inverters.

10. A method of double data rate transfer between a processor and random access memory whereby a delay line creates a delay in a data strobe (DQS) signal of said random access memory, the method comprising:
   receiving a clock reference signal;
   producing a ring oscillator signal with a ring oscillator;
   dividing the ring oscillator signal;
   dividing the clock reference signal; and
   varying a ratio between the ring oscillator signal and the clock reference signal.

11. The method as claimed in claim 10, wherein a delay locked loop receives the clock reference signal.

12. The method as claimed in claim 11, further comprising:
   controlling the delay locked loop by means of a clock signal of the processor.

13. The method of claim 10, wherein the ring oscillator comprises a series of Complementary Metal Oxide Semiconductor (CMOS) inverters.

14. A method of controlling a delay period of a delay locked loop arranged for receiving a clock reference signal and comprising a ring oscillator having a plurality of variable delay elements for producing a ring oscillator signal, the method comprising:
   dividing the ring oscillator signal by a first value;
   dividing the clock reference signal by a second value, wherein the second value is not equal to the first value; and
   varying a ratio of the first value and the second value so as to control the delay period provided by the delay locked loop.

15. The method of claim 14, wherein the ring oscillator comprises a series of Complementary Metal Oxide Semiconductor (CMOS) inverters.

16. The method as claimed in claim 15, further comprising:
   replicating a time value of each delay element within the delay locked loop within a slave delay line.

17. The method of claim 15, wherein the delay period is proportional to a bus rise time for an input data (DQ) signal.

18. The method of claim 10, further comprising:
   continuously monitoring the data strobe (DQS) signal.

19. The method of claim 15, further comprising:
   continuously monitoring the data strobe (DQS) signal.

* * * * *